(12) United States Patent
Huang et al.

(10) Patent No.: US 7,588,955 B2
(45) Date of Patent: Sep. 15, 2009

(54) METHOD FOR PROMOTING LIGHT EMISSION EFFICIENCY OF LED USING NANORODS STRUCTURE

(75) Inventors: Hung-Wen Huang, Hsinchu (TW);
Tien-Chang Lu, Hsinchu (TW);
Ching-Hua Chiu, Hsinchu (TW);
Hao-Chung Kuo, Hsinchu (TW);
Shing-Chung Wang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/984,247

(22) Filed: Nov. 15, 2007

(65) Prior Publication Data
US 2008/0305568 A1 Dec. 11, 2008

(30) Foreign Application Priority Data
Jun. 11, 2007 (TW) .............................. 96120916 A

(51) Int. Cl.
*H01L 21/00* (2006.01)

(52) U.S. Cl. .................... 438/34; 438/28; 257/E33.008
(58) Field of Classification Search .................... 438/34
See application file for complete search history.

(56) References Cited

U.S. PATENT DOCUMENTS

| 2006/0131597 A1* | 6/2006 | Lee et al. ....................... 257/98 |
| 2007/0052108 A1* | 3/2007 | McKinnell et al. ........... 257/777 |
| 2007/0181889 A1* | 8/2007 | Orita ............................ 257/79 |

* cited by examiner

*Primary Examiner*—Hoai v Pham
*Assistant Examiner*—Kimberly Trice
(74) *Attorney, Agent, or Firm*—Bacon & Thomas PLLC

(57) ABSTRACT

Method for the light emitting diode (LED) having the nanorods-like structure is provided. The LED employs the nanorods are subsequently formed in a longitudinal direction by the etching method and the PEC method. In addition, the plurality of the nanorods is arranged in an array so that provide the LED having much greater brightness and higher light emission efficiency than the conventional LED.

6 Claims, 7 Drawing Sheets

METHOD FOR PROMOTING LIGHT EMISSION EFFICIENCY OF LED USING NANORODS STRUCTURE

BACKGROUND OF THE INVENTION

1. Field of the Invention

The invention relates to a light emitting diode (LED) structure, more particularly to a LED structure by employing the nanorods-like structure to raise the light emission efficiency.

2. Description of the Prior Art

Due to the one of the character light emitting diode (LED) is the high light emission efficiency, thus there is the higher potential to become the illumination equipment of the new generation. However, if the present illumination equipments are going to be totally substituted, the light emission efficiency of LED will be highly raised, so that the high brightness LED brightness can be made. One of the best solutions is to produce the nanorods-like structure for LED.

In the prior art, the nanorods-like structure formed in LED can be used to release the stress, and reduce the piezoelectric effect. The formation of the nanorods-like structure can also increase the sidewall-surface area to raise the light emission efficiency.

However, most of the nanorods-like structure is formed directly by the crystal growth in materials science. For example, The hydride vapor phase epitaxy (HVPE) or the formation of GaN-nano-rod can be used. In addition, the etching technology can also be used to produce the nanorods-like structure, such as using E-Beam and Inductively Coupled Plasma (ICP) method to produce the nanorods-like structure. However these methods can not produce the nanorods-like structure in which the electric current can be injected to generate the light emitting component with nanorods-like structure.

For the technology disclosed in the previous literature, there is a U.S. Pat. No. 7,132,677B2 about "Super bright light emitting diode of nanorods array structure having InGaN quantum well and method for manufacturing the same". The GaN-based nano-rod having quantum well structure is used in this patent. The gap among nano-rod is filled by Spin-On Glass (SOG), and only p-type semiconductor is exposed at the top. The metal layer is coated to form ohm contact and to get light emitting element. Though the nanorods-like structure generated by the structure can be used to excite the LED, the epitaxy is utilized to form the mechanism of nanorods-like structure. The hydride vapor phase epitaxy (HVPE) is different from the metal organic chemical vapor deposition (MOCVD) for the formation of LED, there will be have technical problem in future application.

In addition, the conventional light emitting component with nanorods-like structure can not be formed as good LED, because the etching surface of nanorods-like structure high resistance value.

SUMMARY OF THE INVENTION

The invention relates to a process employing the photoelectric chemistry (PEC) method to manufacture the LED with the nanorods-like structure. In the process firstly, a mask layer is formed on a primary layer, and the annealing way is used to form as the mask layer distributed on the primary layer with the plurality of nano level particle masks.

The etching technology is used to etch the part which is not shielded by the particle mask. After etching, the residual particle mask is removed to form the nanorods-like structure on the original primary layer. Then the PEC technology is used. Sequentially the nanorods-like structure is put in the photoelectric oxidization solution, a constant potential is applied and is irradiated by a halogen lamp. The area irradiated by the ray will be to form the oxide layer. Finally, a metal layer is coated to conduct the original primary layer without oxidation.

The feature of the invention is the nanorods-like structure formed in the LED is different from the nanorods-like structure formed by the conventional epitaxy technology. The semiconductor process is used to produce the nanorods-like structure on the surface of epitaxy to raise the light emission efficiency of LED.

Further more, the conventional light emitting component with nanorods-like structure can not be formed as the good and useful LED products, due to the etching surface of nanorods-like structure has high resistance value. The invention employs the PEC and etching technology to form the LED element which can be excited by the electricity.

In the invention, under the condition of direct electrical current, the electrical current will not leak from sidewall, so that the leakage current will not be generated.

Due to the semiconductor process of LED is quite mature, the invention is not only much suitable for the mass production, but also can reduce the manufacturing cost of LED with high brightness.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The invention is a method to use the nanorods-like structure to raise the light emission efficiency of LED. Firstly, the PEC technology is used to oxidize the exposed multiple quantum well in nanorods and n-type semiconductor materials. Thus the nanorods are insulated except the p-type semiconductor at the top. Then the conductive material is coated on un-oxidation p-type semiconductor to be formed ohm contact, in order to produce the LED element which can be excited by the electricity.

The invention particularly uses the nanorods-like structure formed on the LED, and employs the PEC technology to form an oxide layer around the nanorods, in order to get the LED element which can be excited by the electricity. The process for the method to use the nanorods-like structure to raise the light emission efficiency of LED is described as the followings.

Figure 1A:
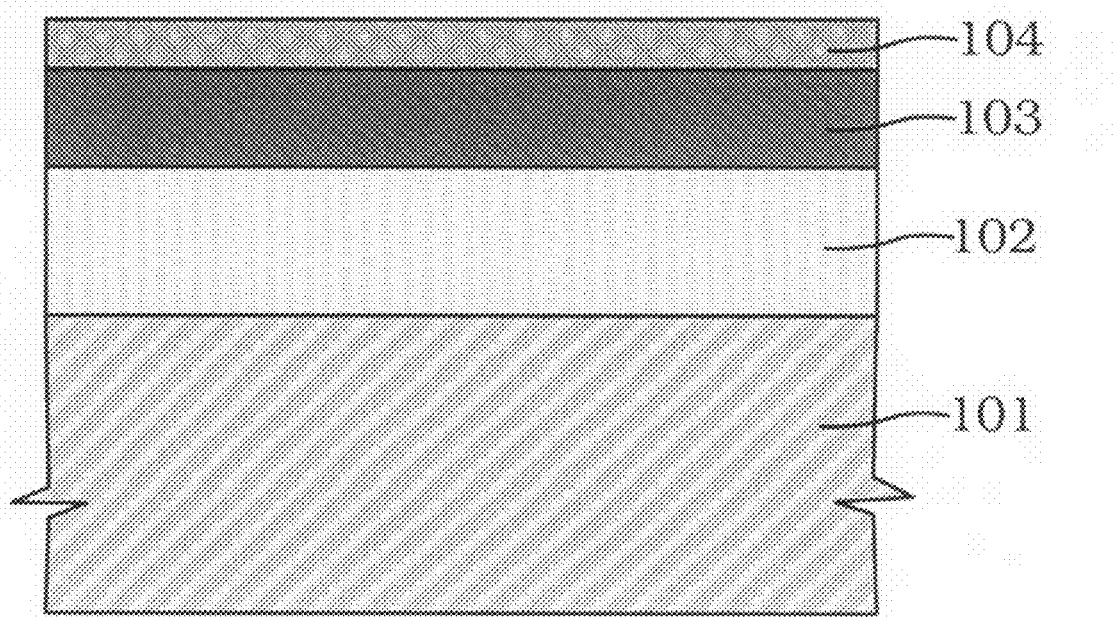
FIG. 1 is the diagram schematically illustrating the embodiment of the invention.

As shown in FIG. 1A, the invention provides a LED structure, which comprises a sapphire substrate 101, a n-type GaN 102 formed on the sapphire substrate 101, a multiple quantum well (MQVV) 103 formed on the n-type GaN 102, and a p-type GaN 104 formed on the multiple quantum well 103.

Figure 1B:
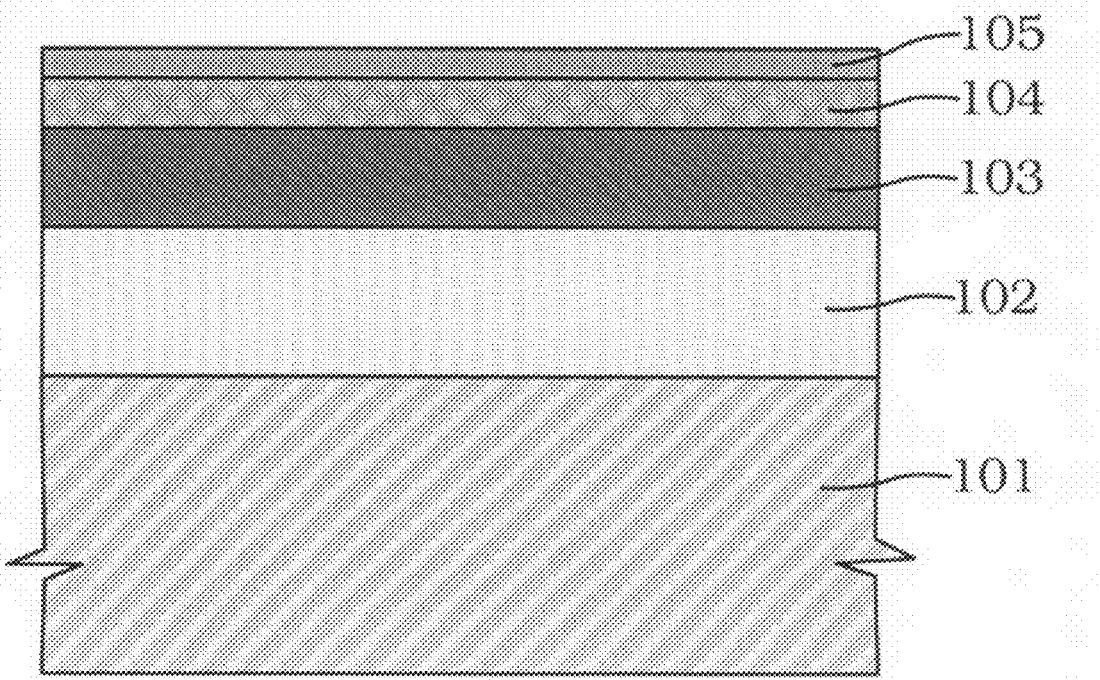

Still as shown in FIG. 1B, the metal coating technology is used to coat a thin nickel layer 105 on the p-type GaN 104 of LED structure. The preferred thickness is about 50 Å to 150 Å, and about 100 Å will be better for the invention.

Figure 1C:
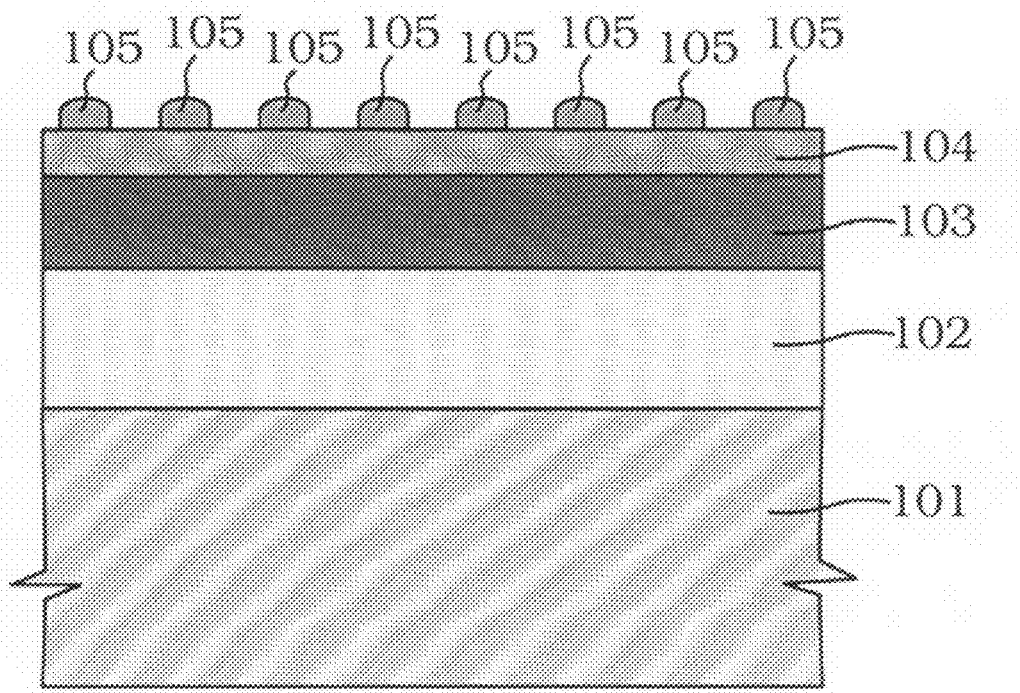

As shown in FIG. 1C, the rapid heat treatment (RTA) is conducted for the LED structure coated with nickel. The preferred temperature is about 750□ to 950□, and about 850□ will be better the invention. The preferred time is about 30 seconds to 120 seconds, and about 60 seconds in the invention. Therefore the plurality of nickel nano level particles 105 can be formed.

Figure 1D:
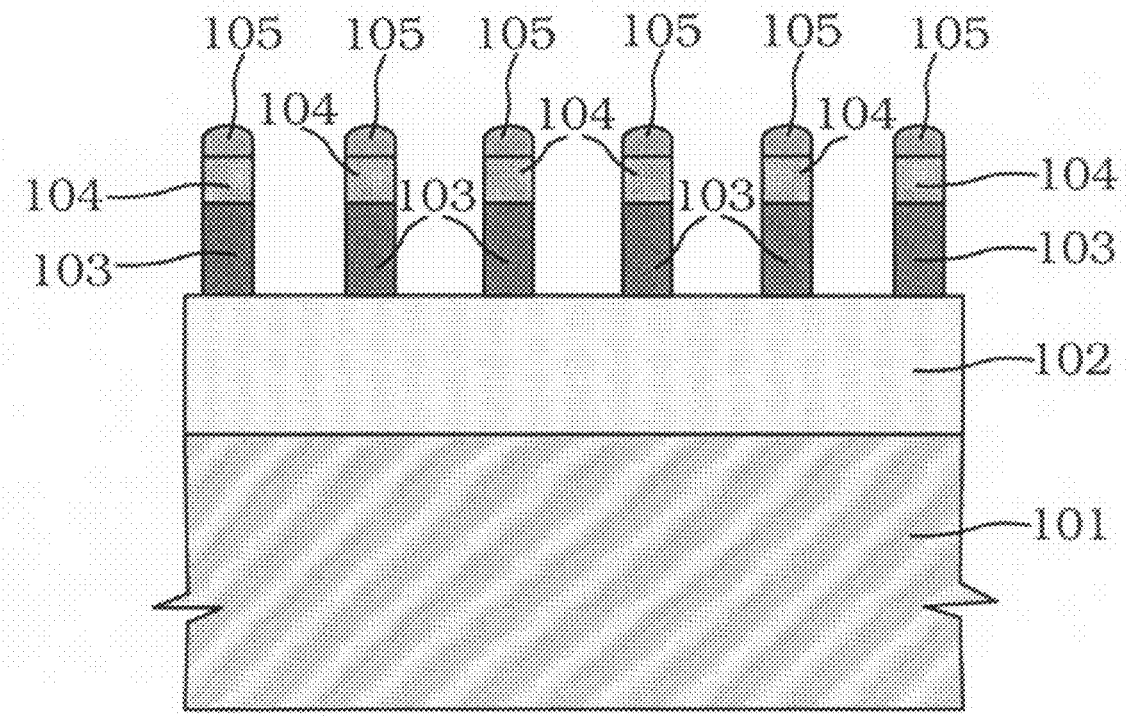

Again, as shown in FIG. 1D, the plurality of nickel nano level particles 105 is used as the mask. The inductively coupled plasma-reactive ion etching (ICP-RIE) technology (dry etching) is used to etch the p-type GaN 104 and the multiple quantum well 103. The plurality of nickel nano level particles 105 can be used as the mask to form the plurality of the nanorods-like structure. The nanorods-like structure would comprise the metal particle 105, the p-type GaN 104 and the multiple quantum well 103. The etching conditions are as follows: the gas flow rate $Cl_2/Ar=50/20$ sccm, the applied power of plasma and bias is 400 W and 100 W, respectively, the pressure is 5 mTorr in the chamber, and the etching time is 2 minutes. After the nanorods-like structure is formed, it is immersed in the etching solution of nitric acid at 100□ for 5 minutes, in order to remove the residual nickel particle. And part of the nanorods-like structure is removed as the electrode.

Figure 1E:
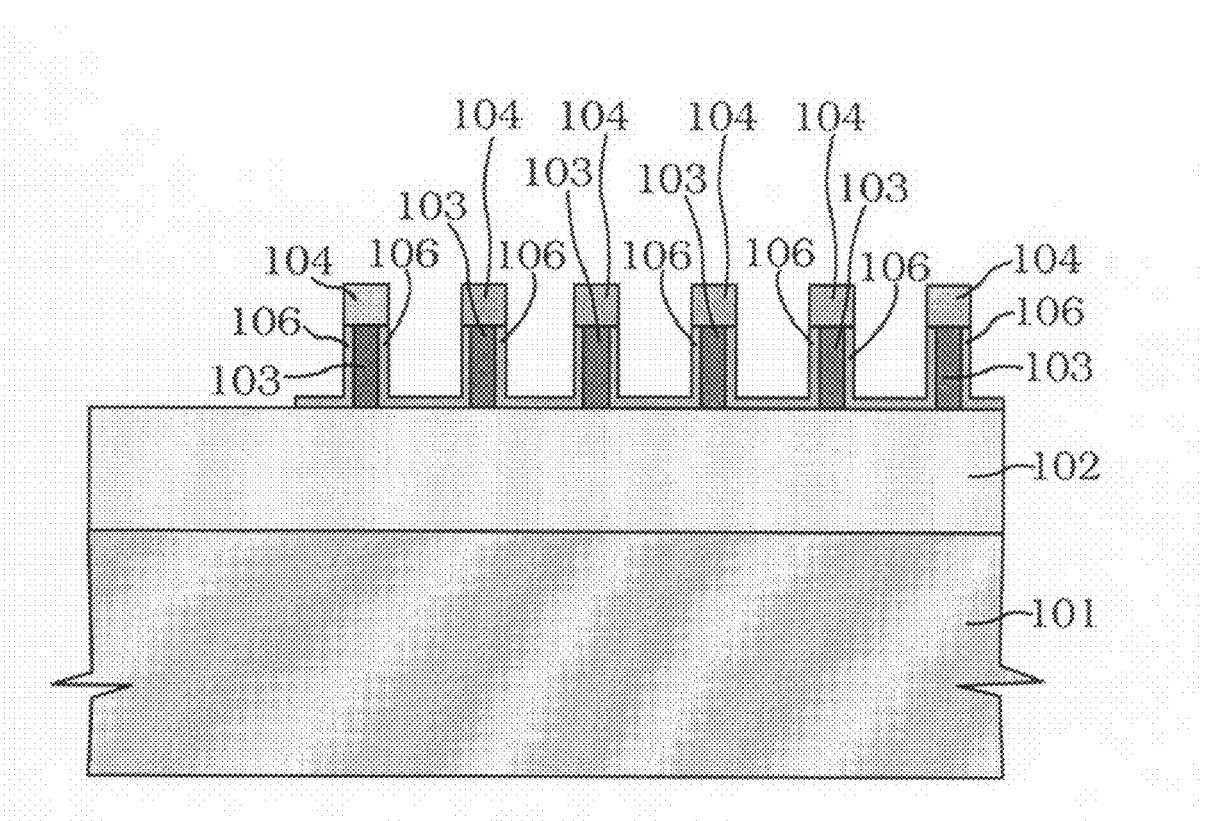

As shown in FIG. 1E, the Photo-electrochemical (PEC) process is conducted. At first, the LED with the nanorods-like structure is fixed on the cathode of a circuit, there put into the photoelectric chemical oxidization solution (such as deionized water). Then, 20 V of voltage is introduced. 300 W of mercury lamp is used to conduct the oxidization reaction. After 10 minutes, except the part of p-type semiconductor, all area irradiated by the mercury lamp is to form an oxide layer ($Ga_2O_3$) 106.

Figure 1F:
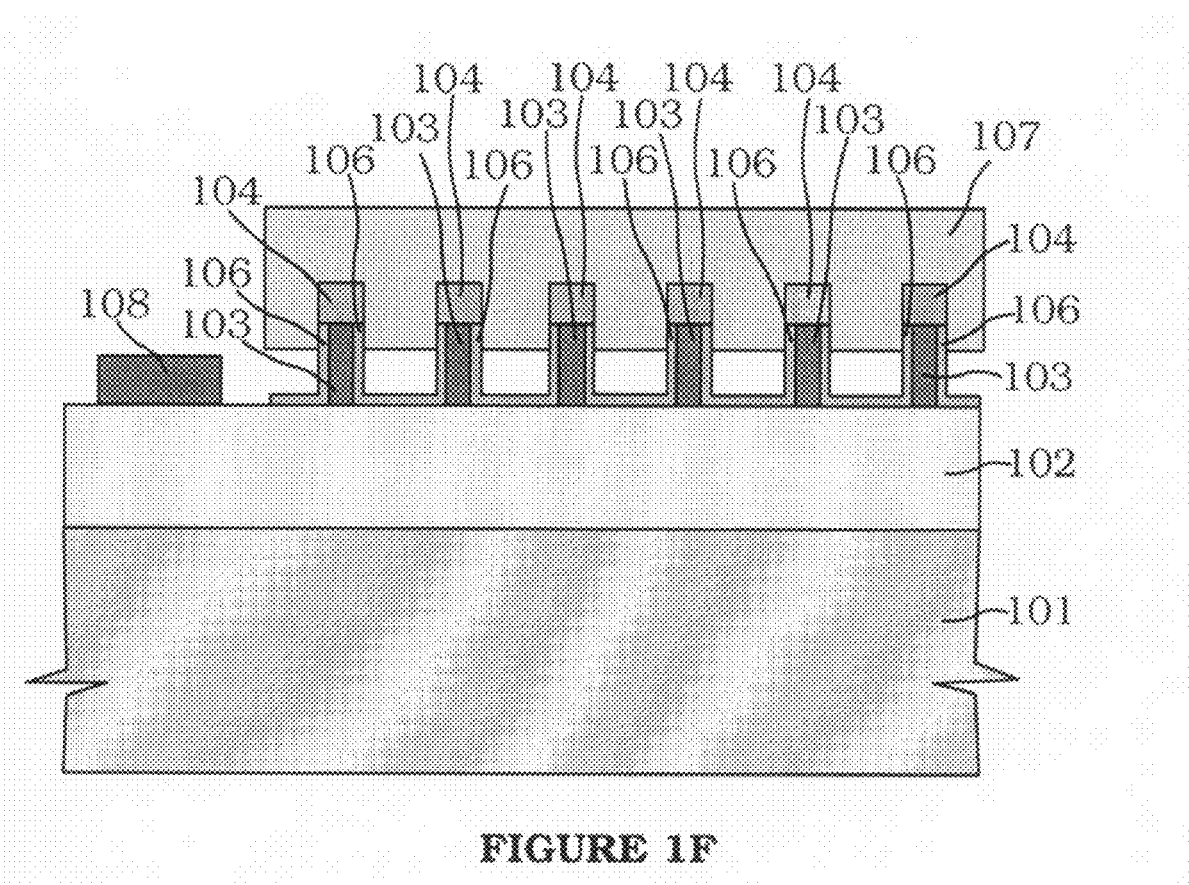

Finally, as shown in FIG. 1F, a nickel/gold layer 107 is coated. Meantime, the chromium/gold is coated on the electrode to form the electrode metal 108, in order to form the LED having the nanorods-like structure.

The invention uses the photoelectric chemical oxidization technology to form the LED with the nanorods-like structure which can be excited by the electricity. In the process, the thickness of nickel can be altered to change the size of metal nano level particles, in order to determine the diameter of nanorods after the etching process.

During the ICP-RIE, the etching time can be altered to change the depth of nanorods. The oxidization time, applied voltage, and light strength of PEC can also be altered to change the thickness of oxidization layer.

Figure 2:
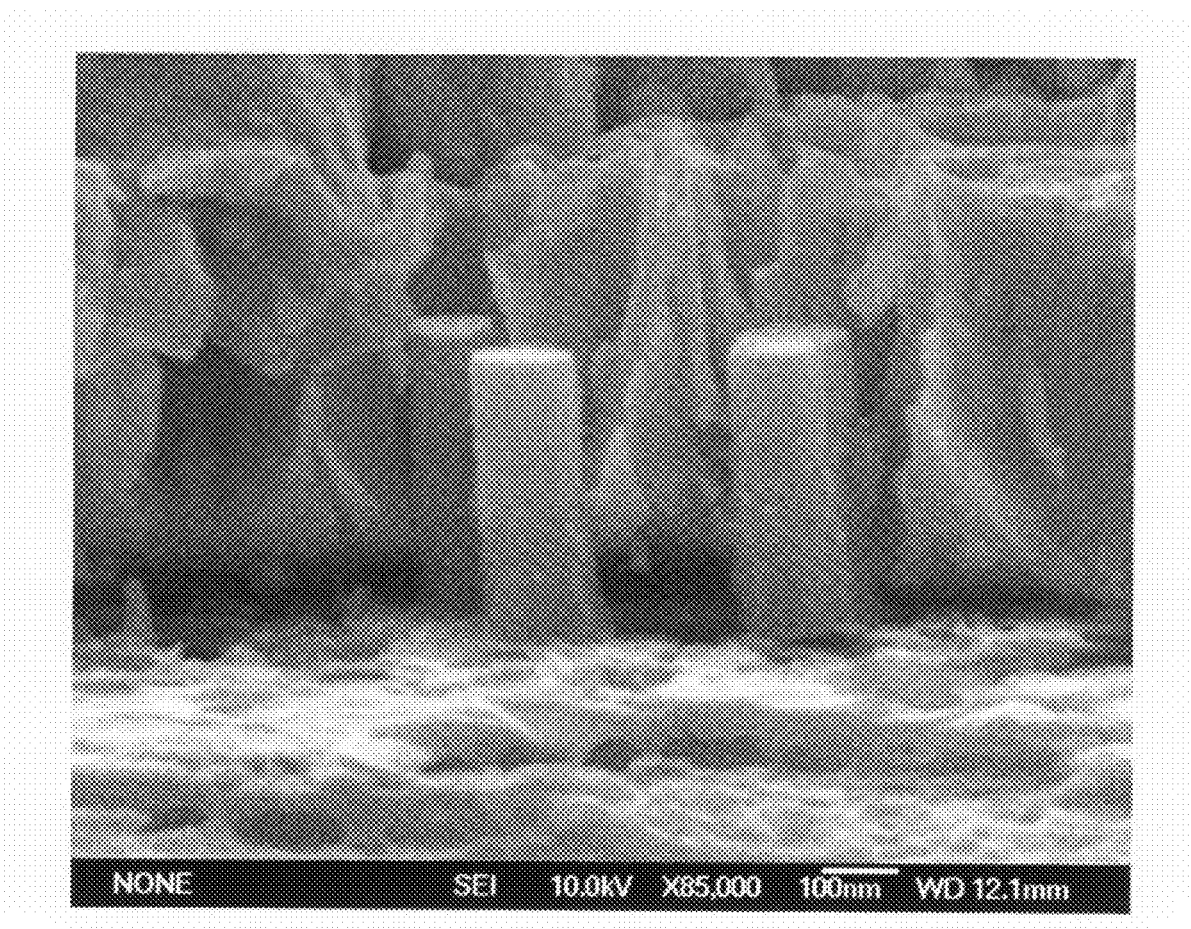
FIG. 2 is the diagram schematically illustrating the magnification of the invention by the Scanning Electronic Microscope (SEM)
Figure 3:
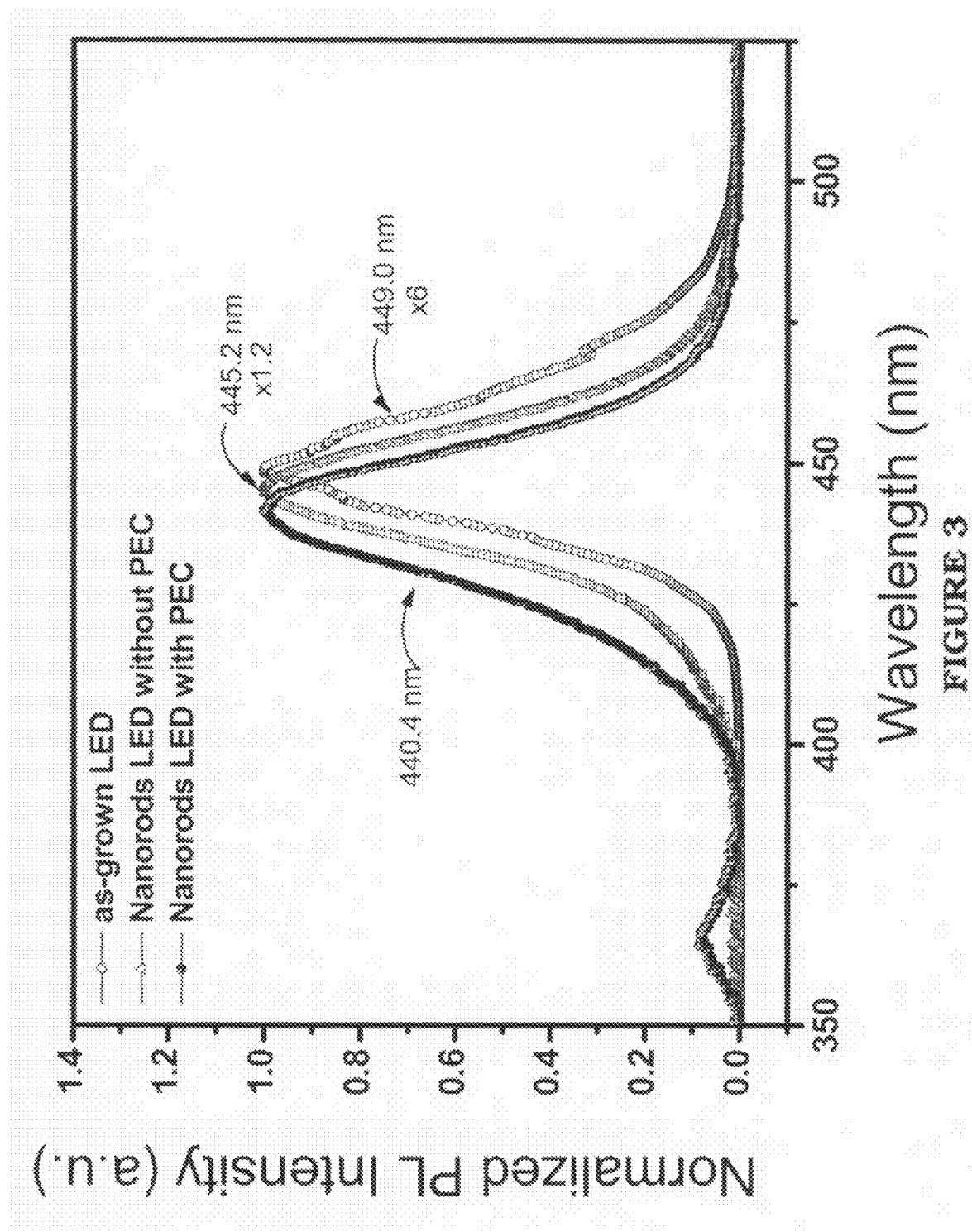
FIG. 3 is the measuring data of the invention.

The invention is verified by the experiment, and FIG. 2 shows the magnification of the invention by the Scanning Electronic Microscope (SEM), which reveals the filling of nanorods after the PEC oxidization. As shown in FIG. 3, the measuring data of the invention is revealed. It described the spectrum of photo-excited light for as-grown LED, nanorods LED with PEC and nanorods LED without PEC.

Figure 4:
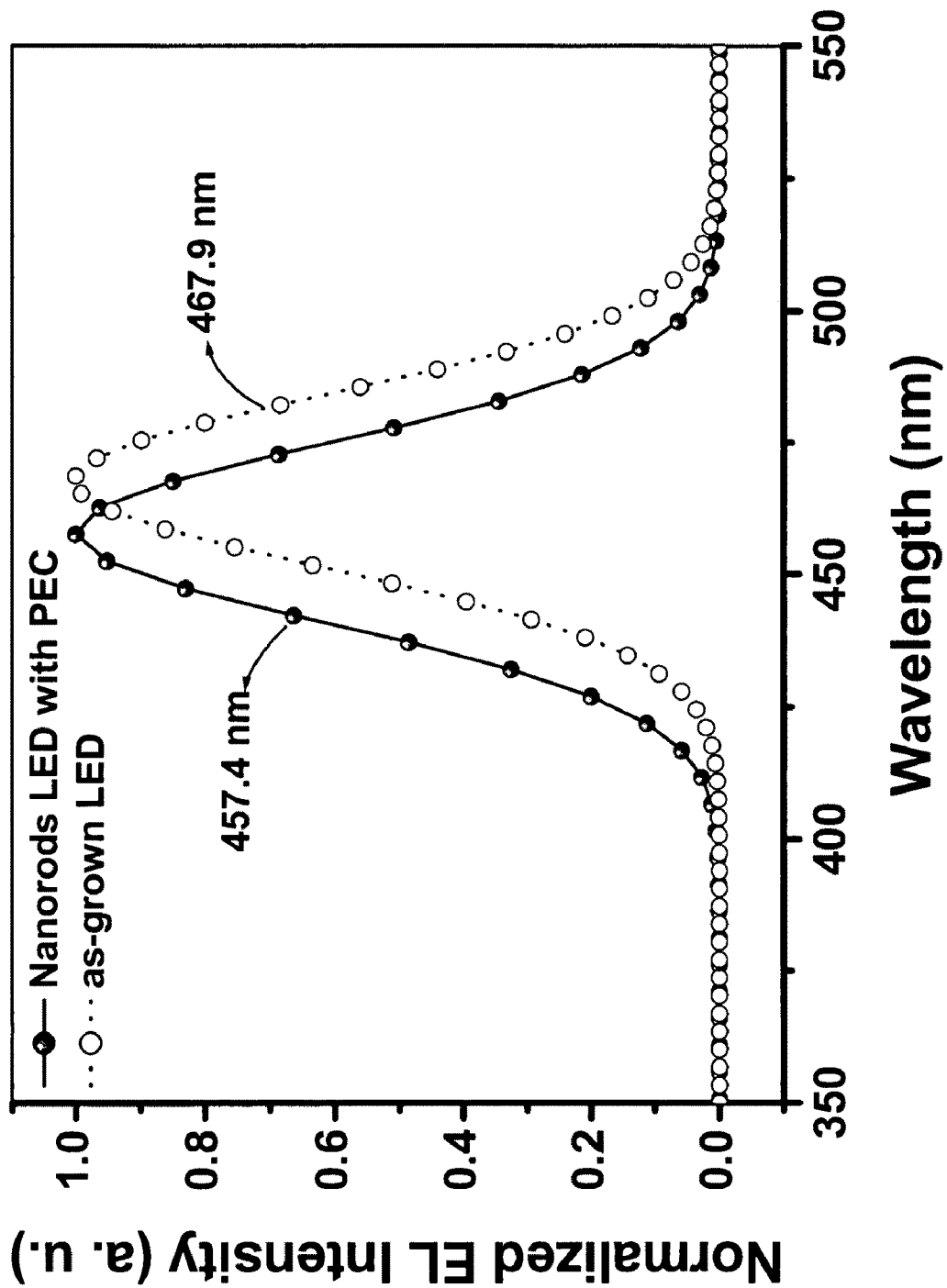
FIG. 4 is the measuring data of the invention.

As shown in FIG. 4, the measuring data of the invention is revealed. It described the spectrum of electro-excited light for as-grown LED and nanorods LED with PEC.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains. If the line pattern is used as the shape of mask, the triangular tunnel will be formed first in the etching process, then the side wall of tunnel will be closed to separate the gallium nitride from the semiconductor substrate. If the dot pattern or random pattern is used as the shape of mask, the hexagonal cone will be formed first in the etching process, then the thick gallium nitride film will separate from the semiconductor substrate.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for raising light emission efficiency of LED by using a nanorods-like structure, comprising:
   providing a sapphire substrate;
   forming an n-type GaN layer on the sapphire substrate;
   forming a multiple quantum well layer on the n-type GaN layer;
   forming a p-type GaN layer on the multiple quantum well layer;
   forming a nickel layer on a surface of the p-type GaN layer;
   forming a plurality of nickel particles by processing a rapid heat treatment by a proper temperature and a proper time;
   dry etching the p-type GaN layer and the multiple quantum well layer to form a plurality of nanorods by using a the nickel particles as a mask so that a plurality of nanorods-like structures are provided;
   removing the plurality of nickel particles by using wet etching;
   forming an oxide layer by processing a photo-electrochemical process used for conducting an oxidization reaction in order to encapsulate the plurality of nanorods-like structure the p-type GaN layer and the multiple quantum well layer; and
   coating a metal layer on the oxide layer to form the LED having the nanorods-like structure.

2. The method according to claim 1, wherein the proper temperature for rapid heat treating is about 750° C. to 950° C.

3. The method according to claim 1, wherein the proper time for the rapid heat treatment is about 30 s to 120 s.

4. The method according to claim 1, wherein the dry etching comprises plasma-reactive ion etching technology.

5. The method according to claim 1, wherein the plurality of nickel particles comprises residual nickel particles.

6. The method according to claim 1, wherein removing the plurality of nickel particles by using wet etching comprises an etching solution of nitric acid.

* * * * *